United States Patent
Harlan et al.

(10) Patent No.: US 12,004,319 B1
(45) Date of Patent: Jun. 4, 2024

(54) RACK INTERLOCK LIMITING THE WITHDRAWAL OF CHASSIS

(71) Applicant: ZT Group Int'l, Inc., Secaucus, NJ (US)

(72) Inventors: Jared Scott Harlan, Secaucus, NJ (US); Kapil Rao Ganta Papa Rao Bala, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 88 days.

(21) Appl. No.: 17/548,880

(22) Filed: Dec. 13, 2021

(51) Int. Cl.
    *H05K 7/14*     (2006.01)

(52) U.S. Cl.
    CPC ................... *H05K 7/1489* (2013.01)

(58) Field of Classification Search
    CPC ... E05B 65/462; E05B 65/463; H05K 5/0208; H05K 7/1489; H05K 7/1488; H05K 7/1498
    USPC .......................................... 361/726
    See application file for complete search history.

(56) References Cited

U.S. PATENT DOCUMENTS

| | | | | |
|---|---|---|---|---|
| 6,615,993 | B1* | 9/2003 | Rudiger | H05K 7/1489 |
| | | | | 211/175 |
| 6,995,973 | B2* | 2/2006 | Barsun | G06F 1/181 |
| | | | | 361/679.57 |
| 8,493,716 | B2* | 7/2013 | Scavuzzo | H05K 5/0208 |
| | | | | 361/679.01 |
| 9,861,196 | B2* | 1/2018 | Chen | A47B 88/50 |
| 10,676,964 | B2* | 6/2020 | Milligan | E05B 65/464 |
| 11,071,228 | B2* | 7/2021 | Hershey | H05K 9/0062 |
| 11,328,137 | B2* | 5/2022 | Freeman | G06F 1/183 |
| 11,419,226 | B1* | 8/2022 | Guduru | H05K 7/1489 |
| 2008/0106175 | A1* | 5/2008 | Huang | E05B 65/464 |
| | | | | 312/217 |
| 2020/0100383 | A1* | 3/2020 | Hershey | H05K 7/1487 |

* cited by examiner

*Primary Examiner* — Patrick D Hawn
(74) *Attorney, Agent, or Firm* — Dergosits & Noah LLP; Todd A. Noah (57) ABSTRACT

A system and method are provided for an interlock that limits the number of electronic devices that may extend from a rack system. In the system, sensors attached to the rack detect the extension of a rail from the rack. The sensors provide a controller with data from which the controller determines a number of rails that are extended from the rack. If the number of extended rails is determined by the controller to exceed a threshold number, the controller actuates a latch system that closes to lock the remaining devices within the rack.

20 Claims, 7 Drawing Sheets

RACK INTERLOCK LIMITING THE WITHDRAWAL OF CHASSIS

BACKGROUND

In systems with multiple rack-mounted devices, each slot within a rack is typically accessible individually for the removal or installation of a device chassis, e.g., a server. During service or installation, a chassis may then be partially inserted into, or withdrawn from, its slot (and only from the front). The partial insertion of the chassis results in that being cantilevered from the rack, which creates a tipping moment. With each chassis having the potential to be in the partially-inserted position, it creates the potential that the sum of the tipping moments may cause the rack to topple.

For example, just a bunch of drive (JBOD) sleds are full of hard-disk drives (HDDs) and can weigh upward of 350 lbs. each. For an exemplary JBOD/rack system, up to four 350 lb. sleds may be extended before the rack tips.

While unlocking only one sled at a time would prevent tipping, it is desirable to be able to access more than one sled at a time for, e.g., transferring hardware. But, for safety reasons, it is also important to prevent too many sleds from extending to prevent tipping.

Similarly, seismic events may dislodge one or more chassis and cause them to be partially inserted. This may again create the potential that the sum of the tipping moments may cause the rack to topple.

Thus, what is needed is an apparatus that limits the number of chassis that may be partially-inserted, thereby limiting the tipping moment that may be applied to the rack by chassis and improving the stability of the rack during both normal operation and seismic events.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a rack interlock system for monitoring and locking sleds within a rack. In embodiments, a rack is equipped with sensors, e.g., reed switches, that indicate when a sled is extended. For example, the sensor is read by a controller, which would determine how many sleds are extended. When a predetermined number of extended sleds have been reached, the controller would activate a mechanism that locks the remaining sleds within the rack. In an embodiment, the predetermined limit on the number of extended sled may be changed and tailored to the rack and the systems inside the rack.

The locking mechanism may be implemented in multiple ways. In an embodiment, a locking bar may be moved into the locked or unlocked position by a single actuator. In an embodiment, a solenoid on one side of a chassis, or pair of solenoids with one on each side of the chassis, or a pair of solenoids on each side of a chassis (e.g., of a tall chassis), may be activated by the controller to lock the chassis in place.

The embodiments provide a system that locks the remaining sleds in the rack after a predetermined number have been extended, thereby both preventing the rack from tipping and allowing access to one or more sleds (as determined by the predetermined threshold number) at the same time.

Figure 1:
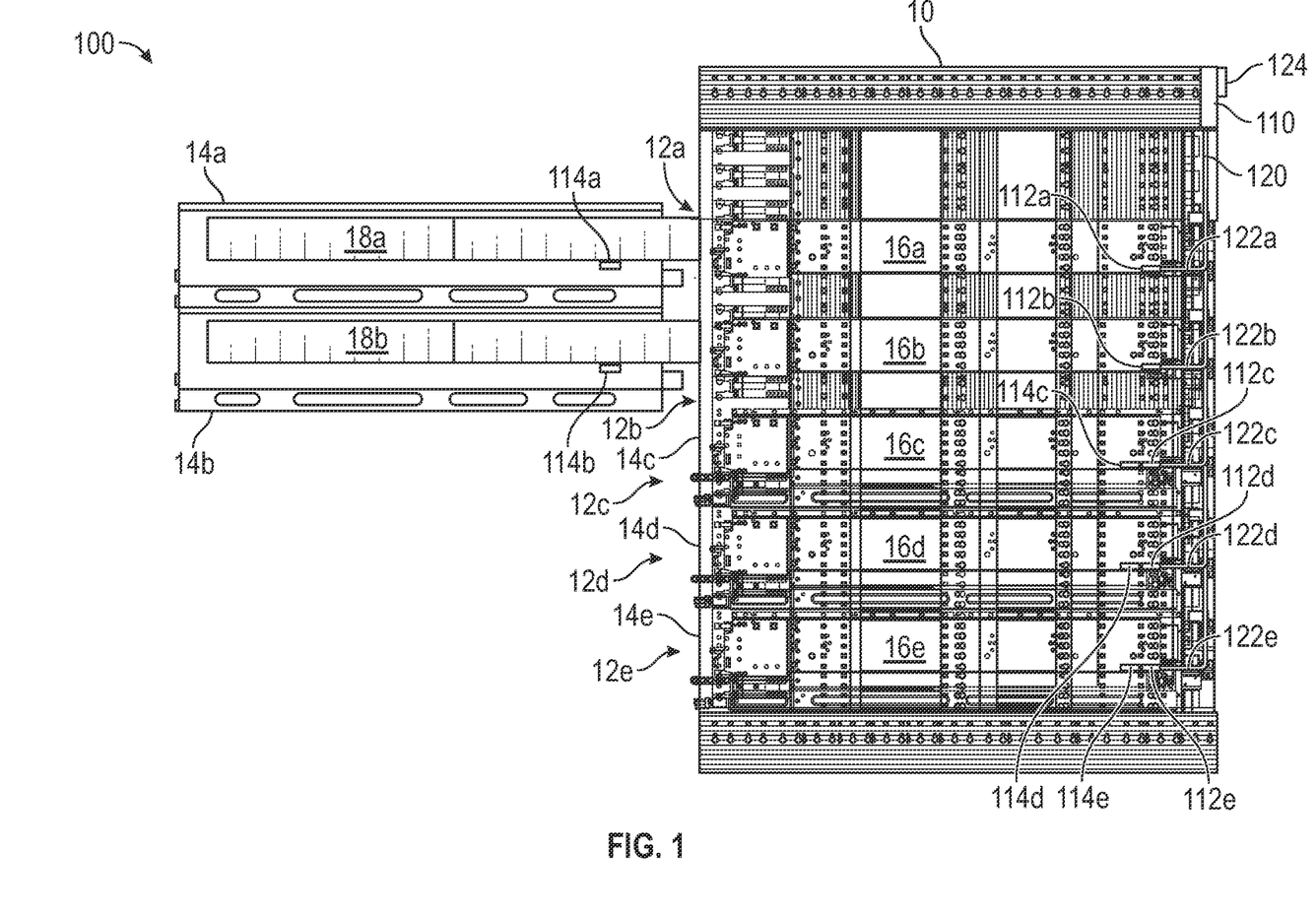
FIG. 1 is a side view illustrating an embodiment of a rack interlock mechanism.

FIG. 1 is a side view illustrating an embodiment of a rack interlock mechanism 100 incorporated into a rack 10. Rack 10 is provided with a number of device slots 12a ... 12e, each slot provided with a rail assembly, here shown with inner rails 18a, 18b (18c ... 18e not shown) moving relative to outer rails 16a ... 16e, which are connected to rack 10. Each side of a device slot 12a ... 12e is fitted with a rail assembly, one side being a mirror of the other. This disclosure is directed to one side for simplicity, but the description of one rail assembly applies equally to its mirror image on the other side of the slot. In an embodiment, each rail assembly may include a middle rail and the following description applies equally to such rail assemblies. Each inner rail 18a ... 18e is configured to accept a device 14a ... 14e, which may be an aggregated group of devices such as a JBOD sled. Inner rails 18a ... 18e move relative to outer rails 14a ... 14e to insert or extract devices 14a ... 14e into or from slots 12a ... 12e.

As shown in FIG. 1, more than one device may be extended from rack 10 by its rail assembly. Extended devices 14a, 14b from rack 10 create a toppling moment that is countered by devices 14c ... 14e remaining within rack 10. Should the number of extended racks create a moment that exceeds the moment created by the remaining racks, rack 10 will topple over. Embodiments of the rack interlock mechanism described within prevent this from occurring.

In FIG. 1, rack interlock system 100 includes, at each slot position, a sensor 112a ... 112e detecting whether the associated inner rail 18a ... 18e is within rack 10 (e.g., rails 18c ... 18e) or extended from rack 10 (18a, 18b). In an embodiment, sensor 112a ... 112e may be a reed switch whose state changes based on the proximity or absence of an associated magnet 114a ... 114e attached to an inner rail. As shown, the sensor state associated with the absence of a magnet would indicate that the associated inner rail is extended from rack 10. System 100 includes a controller 110, which detects, or is provided with, the state of each sensor 112a ... 112e via a connection 122a ... 122e, which may branch from a wiring harness 120. Controller 110 is further provided with a number indicating the maximum (or "threshold") number of devices 14a ... 14e that may be extended from rack 10. In embodiments, when controller 110 determines that the number of extended rails (e.g., 18a, 18b) is equal to the threshold number, controller 110 directs the actuation of a locking assembly that prevents any additional rails (e.g., 18c ... 18e) from being extended. Locking assemblies are described with regard to FIG. 2-FIG. 5.

In an embodiment, controller 110 may be provided with the threshold number of devices in an initial programming step. In an embodiment, controller 110 may be provided with the threshold number via an input device connected to the controller, which may include a keyboard or one or more mechanical switches, such as a rotary switch. In an embodiment, connections 122a . . . 122e may be implemented wirelessly, e.g., using a Bluetooth connection with controller 110.

Figure 2:
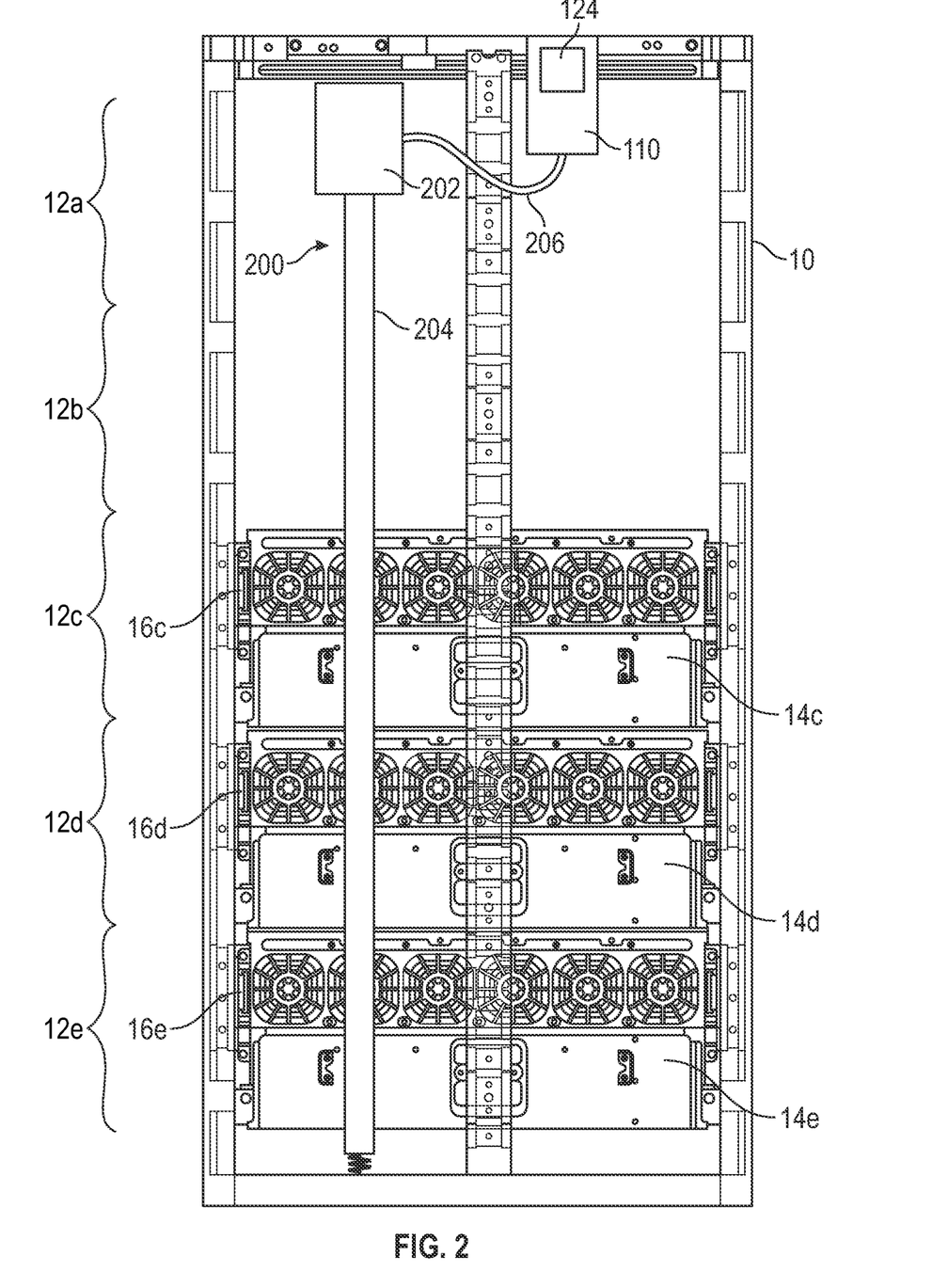
FIG. 2 is a rear view illustrating an embodiment of a rack interlock mechanism.

FIG. 2 is a rear view illustrating an embodiment of a rack interlock mechanism 100. In FIG. 2, the rack interlock mechanism includes a locking assembly 200 with an actuator 202 configured to change the position of a locking bar 204. In use, controller 110 monitors sensor data and tallies the number of rails that are extended from rack 10. When the controller determines that the threshold number of rails are extended from rack 10, controller 110, via connection 206, directs actuator 202 to change the position of 204 from an unlocked position to a locked position. In the locked position, bar 204 engages an element of the remaining, non-extended devices (e.g., 14c . . . 14e as shown in FIG. 2), preventing them from extending from rack 10.

Figure 3:
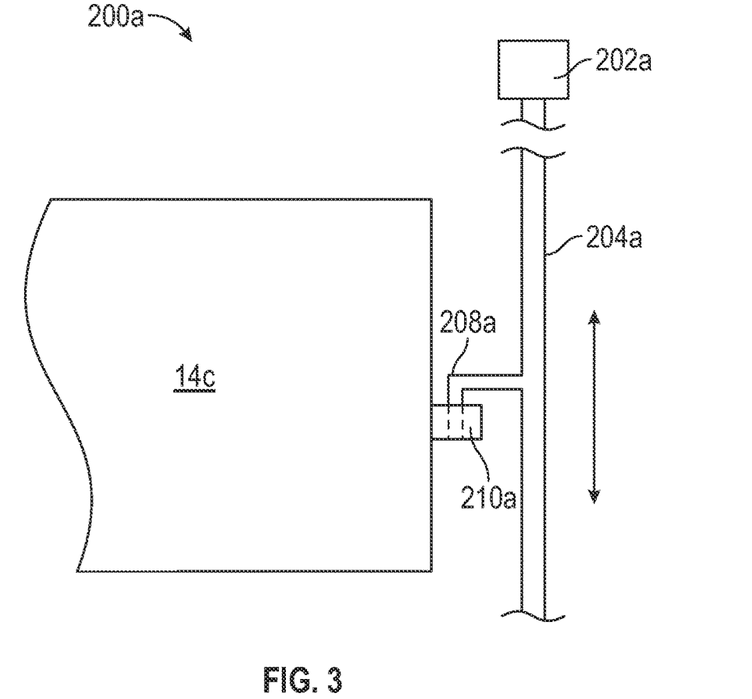
FIG. 3 is a side view illustrating an aspect of an embodiment of a rack interlock mechanism.

FIG. 3 is a side view illustrating a locking assembly 200a for rack interlock system 100. In FIG. 3, locking assembly 200a includes a linear actuator 202a moving a locking bar 204a vertically between a raised, unlocked position and a lowered locked position. In the raised position, a vertically-oriented hook 208a (with one such hook provided for each slot 12a . . . 12e) is disengaged from a ring 210a (with one such ring provided on each device 14a . . . 14e). With regard to FIG. 2, the lowering of locking bar 204a would engage the hooks and associated rings in slots 12c . . . 12e, locking devices 14c . . . 14e within rack 10. In an embodiment, rings are connected to the rail assemblies, e.g., inner rails 18 and the hooks of locking bar 204a would engage the rings to lock the devices within rack 10.

Figure 4:
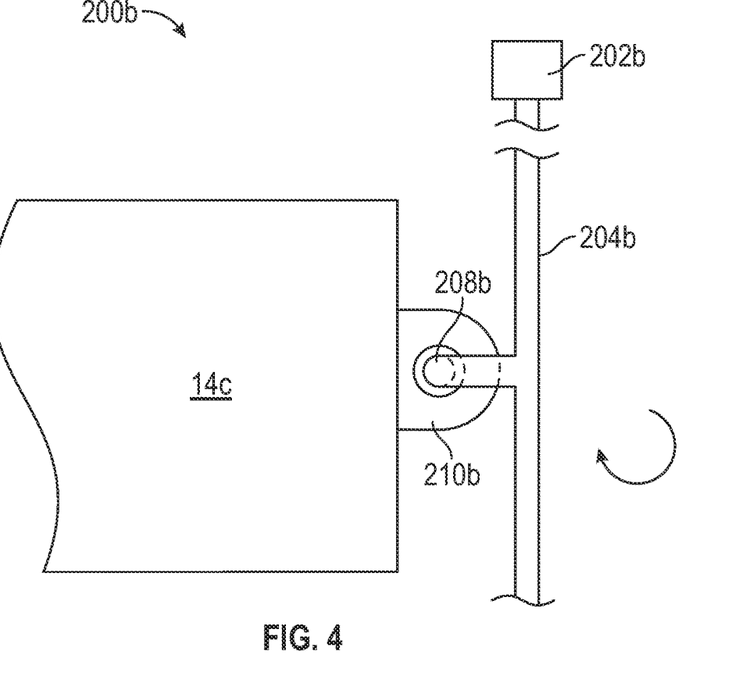
FIG. 4 is a side view illustrating an aspect of an embodiment of a rack interlock mechanism.

FIG. 4 is a side view illustrating a locking assembly 200b for rack interlock system 100. In FIG. 3, locking assembly 200b includes a rotary actuator 202b rotating a locking bar 204b about its vertical axis between an unlocked position and a locked position. In the locked position, a horizontally-oriented hook 208b (with one such hook provided for each slot 12a . . . 12e) is disengaged from a ring 210b (with one such ring provided on each device 14a . . . 14e). With regard to FIG. 2, the rotation of locking bar 204b would engage the hooks and associated rings in slots 12c . . . 12e, locking devices 14c . . . 14e within rack 10.

Figure 5:
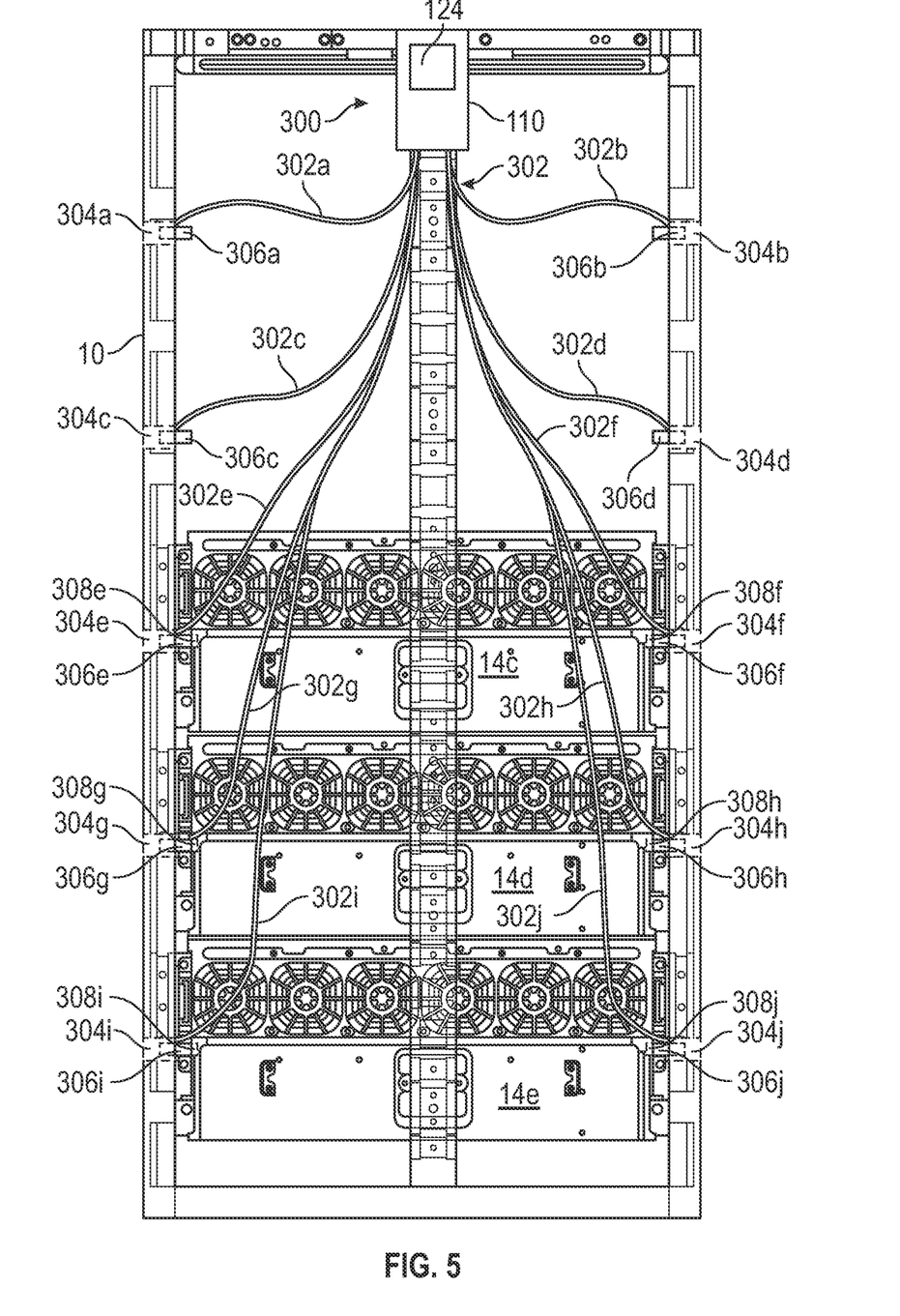
FIG. 5 is a rear view illustrating an embodiment of a rack interlock mechanism.

FIG. 5 is a rear view illustrating an embodiment of a rack interlock system 300. In FIG. 5, rack interlock system 300 includes sensors 112a . . . 112e as described within (not shown in FIG. 5). In the embodiment of FIG. 5, the locking of devices within rack 10 is accomplished using a locking assembly 300, in which solenoids 306a . . . 306j are disposed in rack 10 and connected to controller 110 via connections 302a . . . 302j, which may branch from a wiring harness 302. Solenoids 304a . . . 304j each include a pin 306a . . . 306j. Devices 14a . . . 14e include a hole 308a . . . 308j configured to receive the associated pin 306a . . . 308j when the device is retained within rack 10. When system 300 is in use, controller 110, which detects, or is provided with, the state of each sensor 112a . . . 112e via a connection 122a . . . 122e, directs actuators 304a . . . 304j to actuate when controller 110 determines that a threshold number of rails are 18a . . . 18e are extended from rack 10. When a device (e.g., device 14e) is within rack 10 and a solenoid is actuated (e.g., solenoid 304j), a pin (e.g., 306j) extends into a hole (e.g., 308j) disposed in the device and locks the device within rack 10.

Furthermore, components of each of the various embodiments may be gathered separately and incorporated into a kit that may be fitted to an existing rack 10 and related devices.

Figure 6:
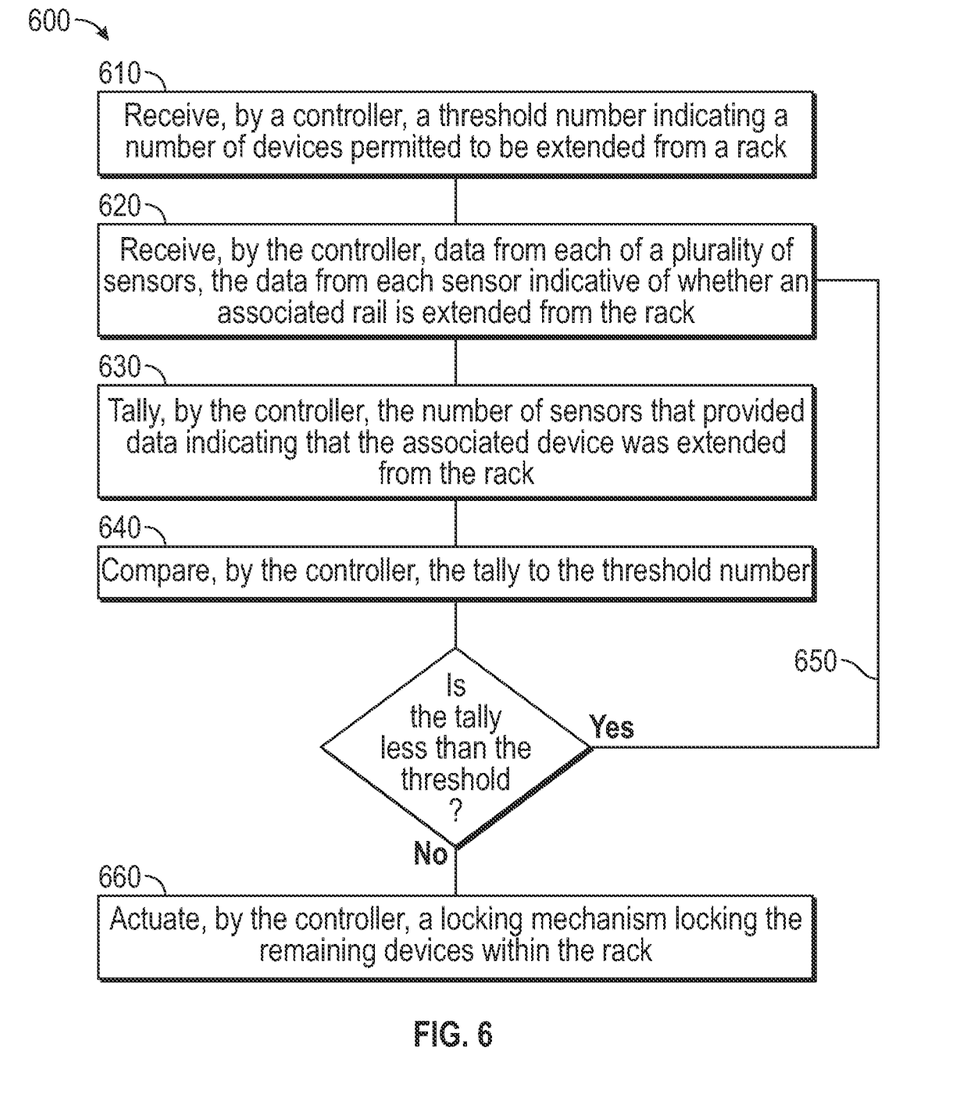
FIG. 6 is a flow chart for a method of operating a rack interlock mechanism.

FIG. 6 is a flow chart illustrating a method 600 for preventing a rack from overturning. In FIG. 6, in step 610, a controller is provided with a threshold number indicating the number of devices permitted to be extended from a rack. In step 620, the controller receives data from each of a plurality of sensors, the data from each sensor indicative of whether an associated device is extended from the rack. In step 630, the controller tallies the number of sensors that provided data indicating that the associated device was extended from the rack. In step 640, the controller compares the tally to the threshold. When the tally is less than the threshold, in step 650, the controller returns to step 620. When the tally is not less than the threshold, in step 660, the controller actuates a locking mechanism locking the remaining devices within the rack.

In embodiments, other solenoid configurations are envisioned. For example, in an embodiment, only one solenoid may be disposed in each slot 12a . . . 12e, the single solenoid locking the associated device within rack 10. In an embodiment, each solenoid may be positioned and configured to extend the solenoid pin into a hole provided within the inner rail associated with the slot, which would prevent relative movement between the inner rail and the slot position and lock the device associated with the rail into rack 10. In an embodiment, the solenoid may be disposed on the device or inner rail, and the pin may extend into the rack or outer rail to lock the device within rack 10.

In an embodiment, controller 110 may be a network-enabled controller such that when connected to a network 760 (FIG. 7), controller 110 may be accessed over the network and given instructions. For example, network 760 may include a wide area network, such as the Internet or a cellular network, and local wireless networks, such as Wi-Fi or Bluetooth. Using the network 760, a technician may interface with controller 110 using, e.g., a web browser or dedicated application executed on a computing device 710a-710f (FIG. 7), to direct controller 110 to actuate the locking mechanism, e.g., actuator 202, or solenoids 306a . . . 306j. In embodiments, controller 110 may be accessed over network 760 to determine the status of the locking mechanism. In embodiments, controller 110 may initiate the sending of an alert over network 760, e.g., to a technician, when the status of the locking mechanism is changed.

Figure 7:
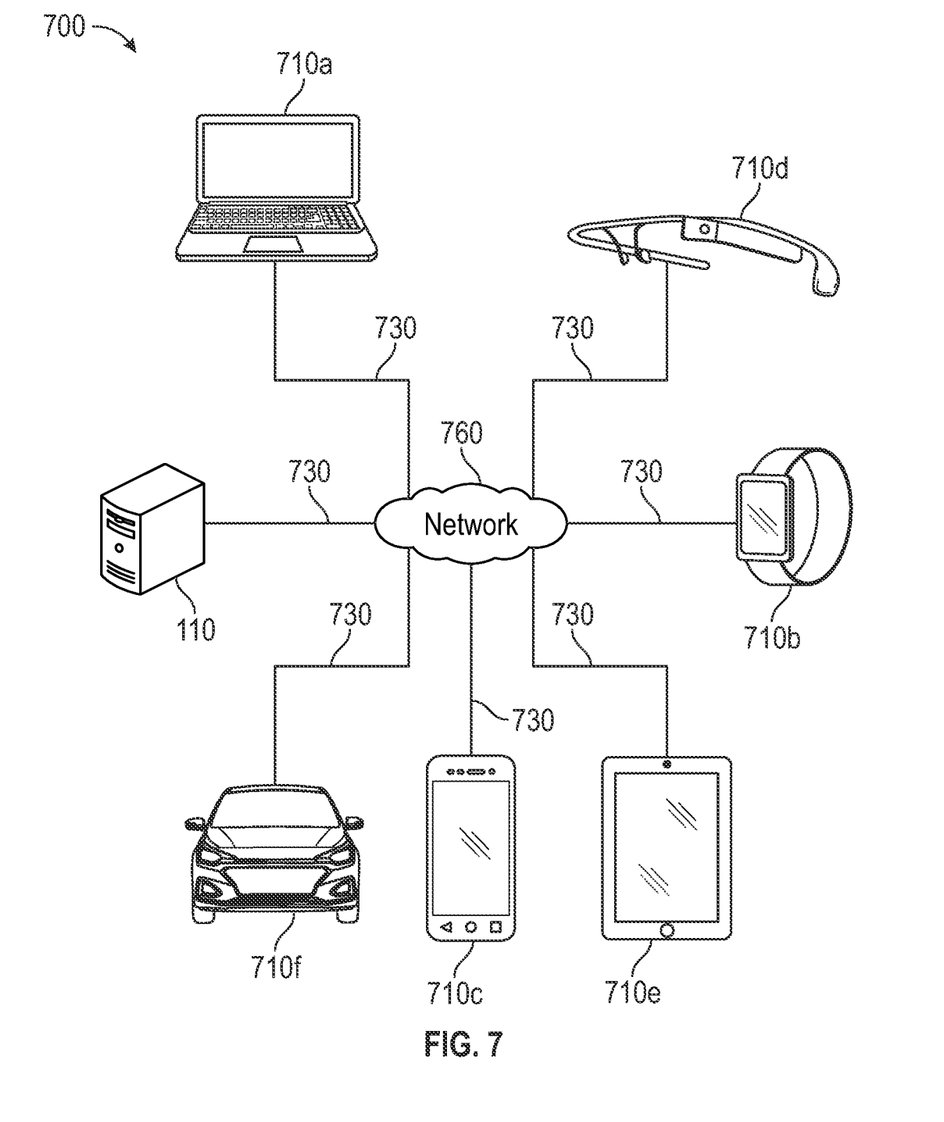
FIG. 7 is an exemplary block diagram depicting an embodiment of system for implement embodiments of methods of the disclosure.

FIG. 7 is an exemplary block diagram depicting an embodiment of system for implement embodiments of methods of the disclosure. In FIG. 7, computer network 700 includes a number of computing devices 710a-710f, with controller 110 coupled to communication network 760 via one of a plurality of potential communication links 730. Communication network 760 provides a mechanism for allowing the various components of distributed network 700 to communicate and exchange information with controller 110.

Communication network 760 itself is comprised of one or more interconnected computer systems and communication links. Communication links 730 may include hardwire links, optical links, satellite or other wireless communications links, wave propagation links, or any other mechanisms for communication of information. Various communication protocols may be used to facilitate communication between the various systems shown in FIG. 7. These communication protocols may include TCP/IP, UDP, HTTP protocols, wireless application protocol (WAP), BLUETOOTH, Zigbee, 802.11, 802.15, 6LoWPAN, LiFi, Google Weave, NFC, GSM, CDMA, other cellular data communication protocols, wireless telephony protocols, Internet telephony, IP telephony, digital voice, voice over broadband (VoBB), broadband telephony, Voice over IP (VoIP), vendor-specific protocols, customized protocols, and others. While in one embodiment, communication network 760 is the Internet, in other embodiments, communication network 760 may be any suitable communication network including a local area network (LAN), a wide area network (WAN), a wireless network, a cellular network, a personal area network, an intranet, a private network, a near field communications (NFC) network, a public network, a switched network, a peer-to-peer network, and combinations of these, and the like.

In an embodiment, the controller 110 is not located near a user of a computing device, and is communicated with over network 760. The controller 110 communicates with the other components of network 700 via wired links or via low powered short range wireless communications such as BLUETOOTH. In an embodiment, one of the other components of the network 700 plays the role of a server. Other types of computing devices 710 include other wearable devices, devices incorporated into clothing, implantable or implanted devices, ingestible devices, or 'things' in the Internet of things, which may be sensors or actuators or mobile or sessile devices, or hubs or servers controlling such 'things' or facilitating their communications.

Distributed computer network 700 in FIG. 7 is merely illustrative of an embodiment incorporating the embodiments and does not limit the scope of the invention as recited in the claims. One of ordinary skill in the art would recognize other variations, modifications, and alternatives. For example, more than one server may be connected to communication network 760. As another example, a number of computing devices 710a-710f may be coupled to communication network 760 via an access provider (not shown) or via some other server system.

Computing devices 710a-710f typically request information from a server system within network 760 that provides the information. Server systems by definition typically have more computing and storage capacity than these computing devices, which are often such things as portable devices, mobile communications devices, or other computing devices that play the role of a client in a client-server operation.

Controller 110 is responsible for receiving information requests from computing devices 710a-710f, for performing processing required to satisfy the requests, and for forwarding the results corresponding to the requests back to the requesting computing device. The processing required to satisfy the request may be performed by controller 110 or may alternatively be delegated to other servers connected to communication network 760 or to other communications networks.

Computing devices 710a-710f enable users to access and query information from or request actions by controller 110. Some example computing devices include portable electronic devices (e.g., mobile communications devices) such as the Apple iPhone®, the Apple iPad®, the Palm Pre™, or any computing device running the Apple iOS™, Android™ OS, Google Chrome OS, Symbian OS®, Windows 10, Windows Mobile® OS, Palm OS® or Palm Web OS™, or any of various operating systems used for Internet of Things (IoT) devices or automotive or other vehicles or Real Time Operating Systems (RTOS), such as the RIOT OS, Windows 10 for IoT, WindRiver VxWorks, Google Brillo, ARM Mbed OS, Embedded Apple iOS and OS X, the Nucleus RTOS, Green Hills Integrity, or Contiki, or any of various Programmable Logic Controller (PLC) or Programmable Automation Controller (PAC) operating systems such as Microware OS-9, VxWorks, QNX Neutrino, FreeRTOS, Micrium µC/OS-II, Micrium µC/OS-III, Windows CE, TI-RTOS, RTEMS. Other operating systems may be used. In a specific embodiment, a "web browser" application executing on a computing device enables users to select, access, retrieve, or query information and/or applications stored by controller 110 and to request actions by controller 110. Examples of web browsers include the Android browser provided by Google, the Safari® browser provided by Apple, the Opera Web browser provided by Opera Software, the BlackBerry® browser provided by Research In Motion, the Internet Explorer® and Internet Explorer Mobile browsers provided by Microsoft Corporation, the Firefox® and Firefox for Mobile browsers provided by Mozilla®, and others.

Figure 8:
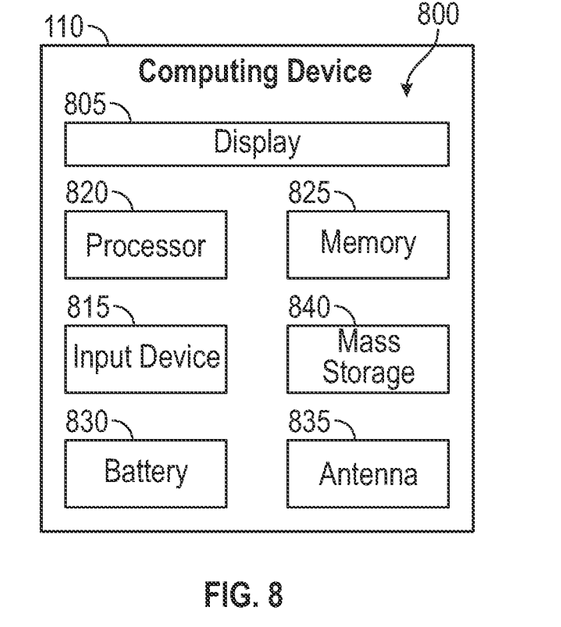
FIG. 8 is an exemplary block diagram depicting a controller of an embodiment.

FIG. 8 is an exemplary block diagram depicting a controller 110 of an embodiment. Controller 110 may include a display, screen, or monitor 1205, housing 1210, and input device 1215. Housing 1210 houses familiar computer components, some of which are not shown, such as a processor 1220, memory 1225, battery 1230, speaker, transceiver, antenna 1235, microphone, ports, jacks, connectors, camera, input/output (I/O) controller, display adapter, network interface, mass storage devices 1240, various sensors, and the like.

Input device 1215 may also include a touchscreen (e.g., resistive, surface acoustic wave, capacitive sensing, infrared, optical imaging, dispersive signal, or acoustic pulse recognition), keyboard (e.g., electronic keyboard or physical keyboard), buttons, switches, stylus, or combinations of these.

Mass storage devices 1240 may include flash and other nonvolatile solid-state storage or solid-state drive (SSD), such as a flash drive, flash memory, or USB flash drive. Other examples of mass storage include mass disk drives, floppy disks, magnetic disks, optical disks, magneto-optical disks, fixed disks, hard disks, SD cards, CD-ROMs, recordable CDs, DVDs, recordable DVDs (e.g., DVD-R, DVD+R, DVD-RW, DVD+RW, HD-DVD, or Blu-ray Disc), battery-backed-up volatile memory, tape storage, reader, and other similar media, and combinations of these.

Embodiments may also be used with controllers having different configurations, e.g., with additional or fewer subsystems. For example, a controller could include more than one processor (i.e., a multiprocessor system, which may permit parallel processing of information) or a system may include a cache memory. The controller shown in FIG. 8 is but an example of a controller suitable for use with the embodiments. Other configurations of subsystems suitable for use with the embodiments will be readily apparent to one of ordinary skill in the art.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. A system comprising:
   a rack including a plurality of slot positions, each slot position provided with a rail configured to receive a device from a plurality of devices, the rail movable from a first position within the rack to a second position extended from the rack;
   a plurality of sensors, each slot position provided with one of the plurality of sensors, each sensor configured to detect when the associated rail is in the second position;
   an elongate element spanning the plurality of slot positions and movable between an unlatched position and a latched position in which any device of the plurality of devices that is in the first position is prevented from moving to the second position;
   an actuator configured to move the elongate element between the unlatched and latched positions; and
   an electronic controller configured to receive position data from each sensor and configured to control the actuator, wherein:
   when the electronic controller receives position data indicating that a threshold number of rails are in the second position, the electronic controller controls the actuator to move the elongate element to the latched position.

2. The system of claim 1 further including, at each of the plurality of slot positions, a hook and ring, wherein movement of the elongate element to the latched position causes, for each rail in the second position, the associated hook and ring to engage, the engagement preventing the associated rail from moving to the first position.

3. The system of claim 2, wherein the movement of the elongate element is linear.

4. The system of claim 2, wherein the movement of the elongate element is rotational.

5. The system of claim 2, wherein the hook is connected to the elongate element and the ring is connected to the rail.

6. The system of claim 2, wherein the hook is connected to the elongate element and the ring is connected to a device connected to the rail.

7. The system of claim 1 further including a rotary switch, wherein the electronic controller is configured to receive the threshold number from the rotary switch.

8. The system of claim 1 further including an electronic interface to the controller, wherein the electronic controller is configured to receive the threshold number from the electronic interface.

9. An apparatus comprising:
   a plurality of sensors for transmitting position data to an electronic controller coupled to a rack, the rack having a plurality of slot positions, each slot position having an associated moveable rail for receiving a device, each sensor being configured to detect when the moveable rail associated with the slot position has moved from a first position in the slot position within the rack to a second position extended from the rack;
   an elongate element movable between an unlatched position and a latched position across the plurality of slot positions in the rack to prevent each of the associated moveable rails that is in the first position from moving to the second position; and
   an actuator coupled to the elongate member for moving the elongate element from the unlatched position to the latched position in response to the electronic controller receiving position data indicating that a threshold number of rails are in the second position.

10. The apparatus of claim 9 further including, at each of the plurality of slot positions, a hook and ring, wherein movement of the elongate element to the latched position causes, for each rail in the second position, the associated hook and ring to engage, the engagement preventing the associated rail from moving to the first position.

11. The apparatus of claim 10, wherein the movement of the elongate element is linear.

12. The apparatus of claim 10, wherein the movement of the elongate element is rotational.

13. The apparatus of claim 10, wherein the hook is connected to the elongate element and the ring is connected to the rail.

14. The apparatus of claim 10, wherein the hook is connected to the elongate element and the ring is connected to a device connected to the rail.

15. The apparatus of claim 9 further including a rotary switch, wherein the electronic controller is configured to receive the threshold number from the rotary switch.

16. The apparatus of claim 9 further including an electronic interface to the controller, wherein the electronic controller is configured to receive the threshold number from the electronic interface.

17. A method comprising:
   detecting, by an electronic controller, in response to receiving position data from using a plurality of sensors associated with a corresponding plurality of rails positioned in a corresponding plurality of slot positions in a rack, a number of the plurality of rails that have moved from a first position within the rack to a second position extended from the rack;
   comparing, by the electronic controller, the detected number of rails that have moved from the first position to the second position to a threshold, the threshold indicating a number of permissible rails to move from the first position to the second position; and
   causing, by the electronic controller, an actuator to move an elongate element spanning the plurality of slot positions, from an unlatched position to a latched position to prevent any device associated with a rail that is in the first position from moving to the second position, in response to a determination that the number of rails moved from the first position to the second position has reached or exceeded the threshold.

18. The method of claim 17, further comprising:
   causing, by the electronic controller, each of a plurality of hooks connected to the elongate element to engage with a respective one of a plurality of rings associated with a corresponding one of the plurality of rails in the second position to prevent the corresponding one of the plurality of rails in the second position from moving to the first position.

19. The method of claim 18, wherein the movement of the elongate element is one of linear or rotational.

20. The method of claim 18, wherein each of the plurality of rings is connected to one of a corresponding one of the plurality of rails or a corresponding one of a plurality of devices connected to the corresponding one of the plurality of rails.

\* \* \* \* \*